United States Patent
Hammerschmidt

(10) Patent No.: US 8,319,491 B2
(45) Date of Patent: Nov. 27, 2012

(54) SYSTEM INCLUDING CIRCUIT THAT DETERMINES CALIBRATION VALUES

(75) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 630 days.

(21) Appl. No.: 12/364,856

(22) Filed: Feb. 3, 2009

(65) Prior Publication Data

US 2010/0194384 A1    Aug. 5, 2010

(51) Int. Cl.
*G01R 35/00*    (2006.01)
(52) U.S. Cl. .................................................. 324/202
(58) Field of Classification Search ............. 324/117 R, 324/117 H, 126, 127, 529, 202, 207.11, 207.12, 324/207.17, 225, 247, 450, 207.26, 239, 324/243, 249, 451, 453, 142, 76.11, 130, 324/207.15, 223, 424; 702/104
See application file for complete search history.

(56) References Cited

U.S. PATENT DOCUMENTS

| | | | |
|---|---|---|---|
| 5,438,257 A | 8/1995 | Berkcan | |
| 5,463,313 A | 10/1995 | Berkcan | |
| 5,570,034 A | 10/1996 | Needham et al. | |
| 6,335,617 B1 * | 1/2002 | Osadchy et al. | 324/202 |
| 6,750,644 B1 | 6/2004 | Berkcan | |
| 6,836,745 B2 * | 12/2004 | Seiler et al. | 702/150 |
| 7,321,226 B2 * | 1/2008 | Yakymyshyn et al. | 324/117 R |

* cited by examiner

*Primary Examiner* — Reena Aurora
*Assistant Examiner* — Alesa Allgood
(74) *Attorney, Agent, or Firm* — Dicke, Billig & Czaja, PLLC

(57) ABSTRACT

A system including magnetic sensing elements and a circuit. The magnetic sensing elements are configured to sense a magnetic field that is generated via a current and to provide signals that correspond to the magnetic field. The circuit is configured to determine calibration values based on the signals and measure the current based on the signals.

25 Claims, 6 Drawing Sheets

SYSTEM INCLUDING CIRCUIT THAT DETERMINES CALIBRATION VALUES

BACKGROUND

Magnetic field sensors measure magnetic flux and/or the strength and direction of a magnetic field. Magnetic field sensors can be used in many applications, including scientific, navigational and industrial applications. Magnetic field sensors use several types of sensing technologies, including magneto-resistive (XMR) sensing technologies and Hall effect sensing technologies. The XMR sensing technologies measure electrical resistance as a function of the applied or ambient magnetic field. The Hall effect sensing technologies convert the energy stored in a magnetic field to an electrical signal by developing a voltage between the two edges of a current-carrying conductor whose faces are perpendicular to the magnetic field.

Often, XMR sensors include a supporting magnet and one or more XMR sensing elements for measuring a magnetic field. The supporting magnet and the XMR sensing elements are in a fixed position relative to each other. The XMR sensing elements do not usually operate in their saturation range and the supporting magnet provides a back bias magnetic field that is superimposed on the XMR sensing elements to stabilize the transfer characteristic of the XMR sensing elements. Changes in an applied magnetic field produce changes in the resistance of the XMR sensing elements. XMR sensing elements include anisotropic magneto-resistive (AMR) sensing elements, giant magneto-resistive (GMR) sensing elements, tunneling magneto-resistive (TMR) sensing elements, and colossal magneto-resistive (CMR) sensing elements.

Usually, in Hall effect sensors a constant current is provided to a Hall element or plate and a magnetic field is applied perpendicular to the current flowing through the Hall plate. Charge carriers in the Hall plate are deflected due to the Lorentz force to create a Hall voltage that is perpendicular to both the magnetic field and the current flow. This Hall voltage can be measured and is directly proportional to the magnetic field.

In some current sensors, a magnetic field sensor is positioned next to a conductor carrying a current. The magnetic field sensor senses the magnetic field generated by the current and measures the current. The strength of the magnetic field depends on the distance from the conductor, such that the strength of the magnetic field decreases with larger distances. To accurately measure the current, the magnetic field sensor is precisely positioned relative to the conductor. However, precisely positioning the magnetic field sensor relative to the conductor can be expensive and adds cost to the current sensor.

In other current sensors, a magnetic field guide, such as a ferromagnetic core, concentrates the magnetic field in an air gap. The magnetic field sensor is positioned in the air gap to sense the magnetic field and measure the current. In this situation, the position of the magnetic field sensor in the air gap is not critical. However, the magnetic field guide can be expensive and adds cost to the current sensor.

For these and other reasons there is a need for the present invention.

SUMMARY

One embodiment described in the disclosure provides a system including magnetic sensing elements and a circuit. The magnetic sensing elements are configured to sense a magnetic field that is generated via a current and to provide signals that correspond to the magnetic field. The circuit is configured to determine calibration values based on the signals and measure the current based on the signals.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
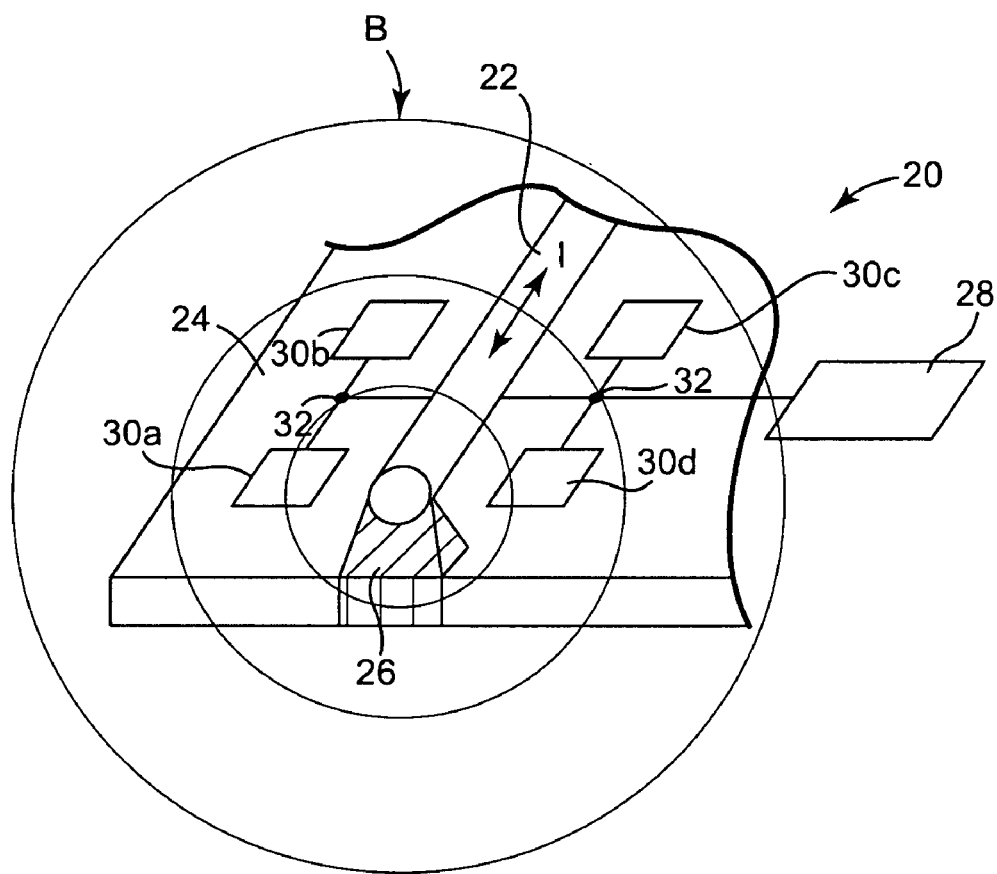
FIG. 1 is a diagram illustrating one embodiment of a system that is used to measure current.

FIG. 1 is a diagram illustrating one embodiment of a system 20 that is used to measure current. System 20 can be used in many applications, including automobile and industrial applications. In one embodiment, system 20 is used to measure current drawn from an automobile battery. In one embodiment, system 20 is used to measure current that drives one or more electric motors.

System 20 includes a conductor 22, a magnetic sensor 24, a clamp 26 and a control circuit 28. Magnetic sensor 24 is clamped to conductor 22 via clamp 26. In one embodiment, conductor 22 is wire. In one embodiment, conductor 22 is a conductive strip, such as a metal bar or metal strip on a circuit board or another substrate.

Magnetic sensor 24 includes magnetic sensing elements 30a-30d. Each of the magnetic sensing elements 30a-30d is electrically coupled to control circuit 28 via signal paths at 32. In one embodiment, magnetic sensing elements 30a-30d and control circuit 28 are on the same integrated circuit chip. In one embodiment, magnetic sensing elements 30a-30d are on one integrated circuit chip and control circuit 28 is on another integrated circuit chip.

Conductor 22 carries a current I that generates a magnetic field B around conductor 22. Magnetic sensing elements 30a-30d sense magnetic field B and provide signals that correspond to the strength of the magnetic field B. In one embodiment, magnetic sensing elements 30a-30d are Hall plate sensing elements. In one embodiment, magnetic sensing elements 30a-30d are XMR sensing elements, such as AMR sensing elements, GMR sensing elements, TMR sensing elements or CMR sensing elements.

Control circuit 28 receives the signals from each of the magnetic sensing elements 30a-30d and determines calibration values based on the signals. The calibration values indicate the position of the magnetic sensing elements 30a-30d in relation to or relative to conductor 22. Control circuit 28 uses the calibration values to determine or measure current I based on the signals. To determine current I and the position of magnetic sensing elements 30a-30d relative to conductor 22 in two dimensions, control circuit 28 processes the signals from at least three different magnetic sensing elements 30a-30d. To determine current I and the position of magnetic sensing elements 30a-30d relative to conductor 22 in three dimensions, control circuit 28 processes the signals from at least five different magnetic sensing elements 30a-30d.

In one embodiment, control circuit 28 receives the signals from magnetic sensing elements 30a-30d and excludes (does not use) the smallest signal levels, such as by excluding the signals that have signal levels below a signal level limit. In one embodiment, control circuit 28 receives the signals from magnetic sensing elements 30a-30d and excludes the signals from magnetic sensing elements 30a-30d that are saturated. In one embodiment, control circuit 28 receives the signals from magnetic sensing elements 30a-30d and includes (uses) at least two signals having a signal difference that is greater than a signal difference limit.

Control circuit 28 measures current I as needed in the application. In one embodiment, control circuit 28 measures current I multiple times between updates of the calibration values. In one embodiment, control circuit 28 determines the calibration values and current I each time current I is measured.

System 20 determines calibration values that indicate the position of the magnetic sensing elements 30a-30d relative to conductor 22 for measuring current I. Thus, magnetic sensing elements 30a-30d do not have to be precisely positioned and held in place to accurately measure current I. Also, system 20 does not use a magnetic field guide that adds cost to the sensor system.

Figure 2:
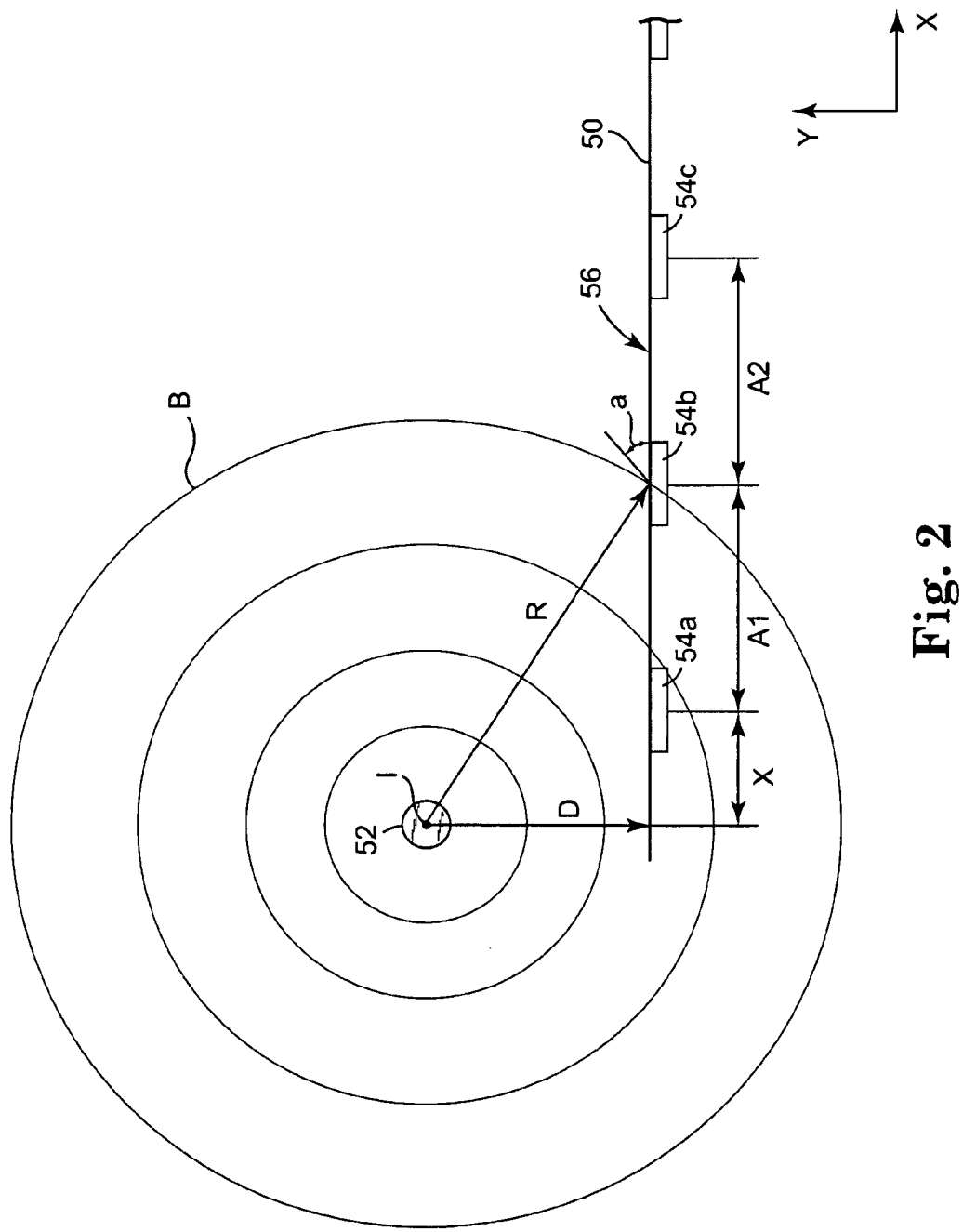
FIG. 2 is a diagram illustrating one embodiment of a magnetic sensor and a conductor.

FIG. 2 is a diagram illustrating one embodiment of a magnetic sensor 50 and a conductor 52. Magnetic sensor 50 and conductor 52 are part of a system, such as system 20 of FIG. 1. In one embodiment, magnetic sensor 50 is similar to magnetic sensor 24 and conductor 52 is similar to conductor 22.

Magnetic sensor 50 includes magnetic sensing elements 54a-54c. Each of the magnetic sensing elements 54a-54c is electrically coupled to a control circuit, such as control circuit 28. In one embodiment, magnetic sensing elements 54a-54c are similar to magnetic sensing elements 30a-30d. In one embodiment, magnetic sensing elements 54a-54c and the control circuit are on the same integrated circuit chip. In one embodiment, magnetic sensing elements 54a-54c are on one integrated circuit chip and the control circuit is on another integrated circuit chip. In one embodiment, each of the magnetic sensing elements 54a-54c is electrically coupled to control circuit 28.

Conductor 52 carries current I, which generates magnetic field B around conductor 52. Magnetic field B is sensed via magnetic sensing elements 54a-54c. In one embodiment, magnetic sensing elements 54a-54c are Hall plate sensing elements. In one embodiment, magnetic sensing elements 54a-54c are XMR sensing elements, such as AMR sensing elements, GMR sensing elements, TMR sensing elements or CMR sensing elements.

The strength of magnetic field B decreases with distance from conductor 52 as shown in Equation I.

$$B(R) = (\mu \times I)/R \qquad \text{Equation I}$$

Where, u is the permittivity constant of the medium, I is the current carried by conductor 52 and R is the radial distance from the center of conductor 52.

In this example, each of the magnetic sensing elements 54a-54c is sensitive to the x-component of magnetic field B. In other embodiments, each of the magnetic sensing elements 54a-54c can be sensitive to another component or other components of magnetic field B.

The strength of magnetic field B in the x-direction Bx at a point on the top major surface 56 of magnetic sensor 50 is shown in Equation II.

$$Bx(R,a) = B(R) \times \cos a \qquad \text{Equation II}$$

Where, B(R) is the strength of the magnetic field B at the radial distance R from the center of conductor 52 to the point on the top major surface 56 of magnetic sensor 50 and "a" is the angle between magnetic field lines of magnetic field B and the top major surface 56 of magnetic sensor 50 at the point on the top major surface 56 of magnetic sensor 50.

The cosine of angle "a" via geometric relationships is shown in Equation III.

$$\cos a = D/R \qquad \text{Equation III}$$

Where, D is the distance from the center of conductor 52 to the top major surface 56 of magnetic sensor 50 and R is the radial distance from the center of conductor 52 to the point on the top major surface 56 of magnetic sensor 50, such as to the center of magnetic field sensor 54b.

If Equation I and Equation III are substituted into Equation II the resulting equation is the strength of magnetic field B in the x-direction Bx in terms of current I, distance D and radial distance R as shown in Equation IV and re-written in Equation V.

$$Bx = (\mu \times I)/R \times (D/R) \qquad \text{Equation IV}$$

$$Bx = (\mu \times I \times D)/R^2 \qquad \text{Equation V}$$

Each of the magnetic sensing elements 54a-54c senses the x-component of the magnetic field Bx at the magnetic sensing element and provides a sensed signal Vn, where n denotes the magnetic sensing element providing the sensed signal Vn. The sensed signal Vn is a function of the x-component of the magnetic field Bx at the magnetic sensing element and the sensitivity Sn of the magnetic sensing element, as shown in Equation VI.

$$V_n = S_n \times Bx \quad \text{Equation VI}$$

If Equation V is substituted into Equation VI, the resulting equation is a function of current I, distance D and radius Rn, as shown in Equation VII.

$$Vn = (S_n \times \mu \times I \times D)/R_n^2 \quad \text{Equation VII}$$

Where, the radial distance Rn is the distance from the center of conductor 52 to the centerline of the magnetic sensing element designated by n.

The radial distance Rn is a function of distance D, offset distance X and spacing distance Am via the Pythagorean theorem, where the distance D is the distance from the center of conductor 52 to the top major surface 56, offset distance X is the distance in the x-direction from conductor 52 to the centerline of magnetic sensing element 54a and spacing distance Am is the distance between centerlines of magnetic sensing elements 54a-54c. In one embodiment, the spacing distance Am is known to a geometrical accuracy in the nanometer range.

In Equation VII with Rn a function of distance D, offset distance X and spacing distance Am, the sensitivity Sn is known to the accuracy achieved via fabrication or calibration in the fabrication process, the permittivity "u" is known and the centerline distance Am is known to the lithographic precision of the fabrication process. This leaves the three unknowns of current I, distance D and offset distance X.

At least three equations are needed to measure the current I and determine the calibration values of distance D and offset distance X. To obtain at least three equations, the control circuit uses at least three sensed signals Vn from three different magnetic sensing elements 54a-54c. The control circuit determines current I and the calibration values of distance D and offset distance X from these three or more equations. With these calibration values, the control circuit has determined the two dimensional position of the magnetic sensing elements 54a-54c relative to conductor 52.

Three example equations that can be solved to measure current I and determine the calibration values of distance D and offset distance X are shown in Equations VIII-X.

$$V1(I,D,X) = (S_1 \times \mu \times I \times D)/(\sqrt{D^2 + X^2})^2 \quad \text{Equation VIII}$$

$$V2(I,D,X) = (S_2 \times \mu \times I \times D)/(\sqrt{D^2 + (X+A_1)^2})^2 \quad \text{Equation IX}$$

$$V3(I,D,X) = (S_3 \times \mu \times I \times D)/(\sqrt{D^2 + (X+A_1+A_2)^2})^2 \quad \text{Equation X}$$

In one embodiment, the control circuit determines the calibration values of distance D and offset distance X each time the current I is measured. In other embodiments, the control circuit uses previously determined calibration values of distance D and offset distance X and determines current I from one or more new measured signals Vn.

Thus, even if conductor 52 moves with respect to magnetic sensing elements 54a-54c, current I is measured accurately by determining the calibration values of distance D and offset distance X. Also, current I is measured without a magnetic field guide that adds cost to the system.

Figure 3A:
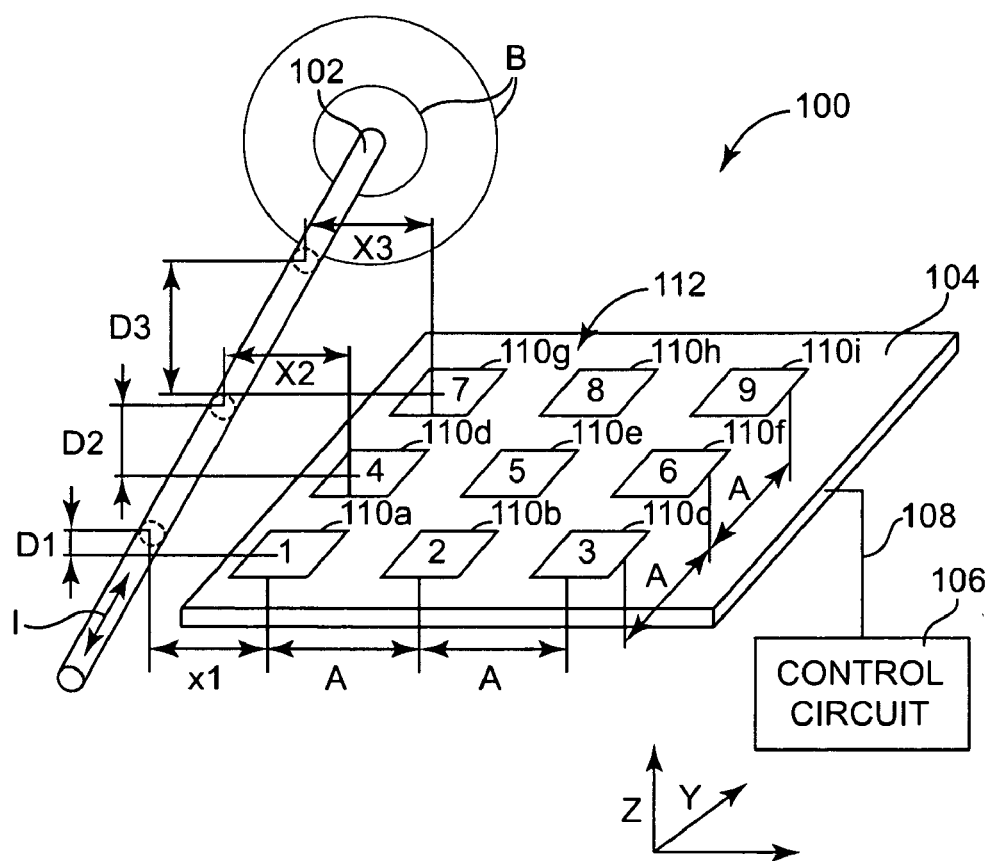
FIG. 3A is a diagram illustrating one embodiment of a system including a conductor, a magnetic sensor and a control circuit.
Figure 3B:
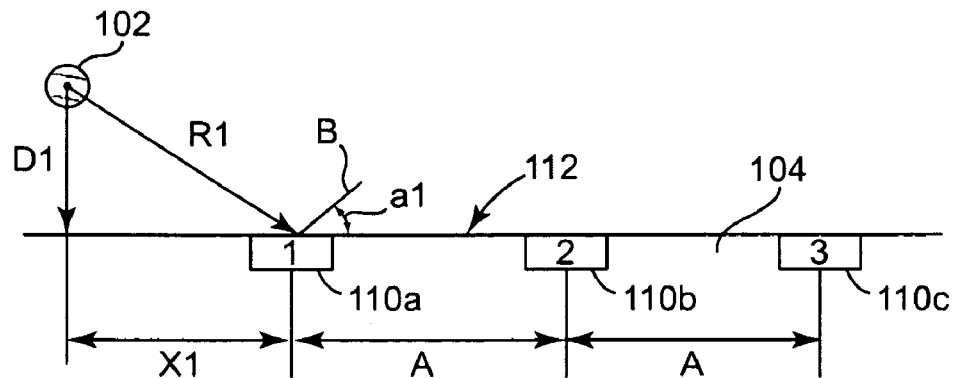
FIG. 3B is a diagram illustrating one embodiment of a cross-section of the conductor and the magnetic sensor.
Figure 3C:
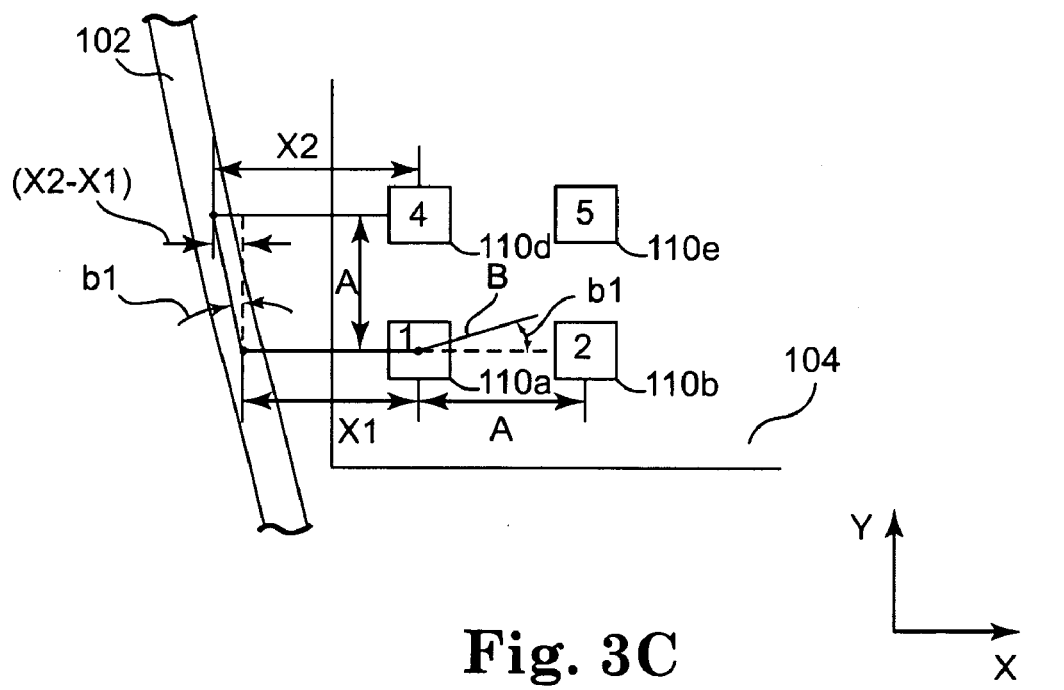
FIG. 3C is a diagram illustrating one embodiment of a top view of the conductor and the magnetic sensor.

FIGS. 3A-3C are diagrams illustrating one embodiment of a system 100 that measures current I carried by conductor 102 and determines the calibration values that indicate the three dimensional position of magnetic sensor 104 relative to conductor 102. In one embodiment, system 100 is similar to system 20 of FIG. 1. In one embodiment, conductor 102 is similar to conductor 22 and magnetic sensor 104 is similar to magnetic sensor 24.

System 100 can be used in many applications, including automobile and industrial applications. In one embodiment, system 100 is used to measure current drawn from an automobile battery. In one embodiment, system 100 is used to measure current that drives one or more electric motors.

FIG. 3A is a diagram illustrating one embodiment of system 100 including conductor 102, magnetic sensor 104 and control circuit 106. Magnetic sensor 104 is clamped to conductor 102 and control circuit 106 is electrically coupled to magnetic sensor 104 via signal paths at 108. In one embodiment, conductor 102 is wire. In one embodiment, conductor 102 is a conductive strip, such as a metal bar or metal strip on a circuit board or another substrate. In one embodiment, control circuit 106 is similar to control circuit 28.

Magnetic sensor 104 includes magnetic sensing elements 110a-110i that are numbered 1-9, respectively. Each of the magnetic sensing elements 110a-110i is electrically coupled to control circuit 106 via the signal paths at 108. In one embodiment, magnetic sensing elements 110a-110i are similar to magnetic sensing elements 30a-30d. In one embodiment, magnetic sensing elements 110a-110i and control circuit 106 are on the same integrated circuit chip. In one embodiment, magnetic sensing elements 110a-110i are on one integrated circuit chip and control circuit 106 is on another integrated circuit chip.

Conductor 102 carries current I that generates a magnetic field B around conductor 102. Magnetic sensing elements 10a-110i sense the magnetic field B and provide signals that correspond to the strength of the magnetic field B. In one embodiment, magnetic sensing elements 110a-110i are Hall plate sensing elements. In one embodiment, magnetic sensing elements 110a-110i are XMR sensing elements, such as AMR sensing elements, GMR sensing elements, TMR sensing elements or CMR sensing elements.

Control circuit 106 receives the signals from each of the magnetic sensing elements 110a-110i and determines the calibration values based on the signals. The calibration values indicate the position of the magnetic sensing elements 110a-110i in three dimensions relative to conductor 106. Control circuit 106 uses the calibration values to determine or measure current I based on the signals. To determine current I and the position of magnetic sensing elements 110a-110i relative to conductor 102 in three dimensions, control circuit 106 processes the signals from at least five different magnetic sensing elements 110a-110i.

Control circuit 106 measures current I as needed in the application. In one embodiment, control circuit 106 measures current I multiple times between updates of the calibration values. In one embodiment, control circuit 106 determines the calibration values and current I each time current I is measured.

The position of conductor 102 relative to magnetic sensing elements 110a-110i is indicated via calibration values of distances D1-D3 and offset distances X1-X3. Distances D1-D3 are the distances from the center of conductor 102 to the top major surface 112 of magnetic sensor 104 (and the magnetic sensing elements 110a-110i). Each of the distances D1-D3 is measured from the row centerline of one of the rows of magnetic sensing elements 110a-110i to the center of conductor 102. These distances D1-D3 differ based on the inclination of conductor 102 relative to magnetic sensor 104. Offset distances X1-X3 indicate the distance that conductor 102 is offset in the x-direction from magnetic sensor 104. Each of the offset distances X1-X3 is measured from the column centerline of the first column of magnetic sensing elements 110a-110i to the center of conductor 102. These distances X1-X3 differ based on divergence of conductor 102 relative to magnetic sensor 104 in the x-y plane. Each of the magnetic sensing elements 110a-110i is separated from neighboring magnetic sensing elements 110a-110i via spacing distance A, which is the distance between centerlines of magnetic sensing elements 110a-110i.

In this example, each of the magnetic sensing elements 110a-110i is sensitive to the x-component of magnetic field B. In other embodiments, each of the magnetic sensing elements 110a-110i can be sensitive to another component or other components of magnetic field B.

The strength of the magnetic field B in the x-direction Bx across magnetic sensor 104 is a function of the inclination of conductor 102 relative to magnetic sensor 104 and the divergence in the x-y plane of conductor 102 relative to magnetic sensor 104. Thus, each of the magnetic sensing elements 110a-110i can sense a different magnetic field strength in the x-direction Bx.

FIG. 3B is a diagram illustrating one embodiment of a cross-section of conductor 102 and magnetic sensor 104. The cross section of magnetic sensor 104 includes magnetic sensing elements 110a-110c that are numbered 1-3, respectively.

A magnetic field line of magnetic field B intersects magnetic sensing element 110a at the center of magnetic sensing element 110a and the top major surface 112 of magnetic sensor 104. The x-component of the magnetic field B is shown in Equation XI.

$$Bxi1(R1,a1) = B(R1) \times \cos a1 \qquad \text{Equation XI}$$

Where, B(R1) is the strength of the magnetic field B at the radial distance R1 from the center of conductor 102 to the point at the center of magnetic sensing element 110a and at the top major surface 112 of magnetic sensor 104, and angle "a1" is the angle between the magnetic field line of magnetic field B and the top major surface 112 of magnetic sensor 104 at this point on the top major surface 112 of magnetic sensor 104. Thus, Bxi1 is the strength of the magnetic field B in the x-direction as adjusted for the inclination of conductor 102 relative to magnetic sensor 104 at magnetic sensing element 110a. An equation similar to Equation XI can be obtained for each of the other magnetic sensing elements 110b-110i that are numbered 2-9, respectively.

FIG. 3C is a diagram illustrating one embodiment of a top view of conductor 102 and magnetic sensor 104. The top view of magnetic sensor 104 includes magnetic sensing elements 110a, 110b, 110d and 110e that are numbered 1, 2, 4 and 5, respectively. The magnetic field line of magnetic field B intersects magnetic sensing element 110a at the center of magnetic sensing element 110a and at the top major surface 112 of magnetic sensor 104. The x-component of the magnetic field B is shown in Equation XII.

$$Bxd1(R1,b1) = B(R1) \times \cos b1 \qquad \text{Equation XII}$$

Where, B(R1) is the strength of the magnetic field B at the radial distance R1 from the center of conductor 102 to the point at the center of magnetic sensing element 110a and the top major surface 112 of magnetic sensor 104, and angle "b1" is the angle between magnetic field lines of magnetic field B and the magnetic sensor 104 at this point in the x-y plane. Thus, Bxd1 is the strength of the magnetic field B in the x-direction as adjusted for the divergence of conductor 102 relative to magnetic sensor 104 in the x-y plane. An equation similar to Equation XII can be obtained for each of the other magnetic sensing elements 110b-110i that are numbered 2-9, respectively.

The strength of the magnetic field B in the x-direction at magnetic sensing element 110a, denoted Bx1, is a function of both angles "a1" and "b1" as shown in Equation XIII.

$$Bx1(R1,a1,b1) = B(R1) \times \cos a1 \times \cos b1 \qquad \text{Equation XIII}$$

An equation, such as Equation XIII, can be derived for the x-component of the magnetic field B at each of the other magnetic sensing elements 110b-110i that are numbered 2-9, respectively.

Each of the magnetic sensing elements 110a-110i senses the x-component of the magnetic field Bx at the magnetic sensing element and provides a sensed signal Vn, where n denotes the number of the magnetic sensing element providing the sensed signal Vn. The sensed signal Vn is a function of the x-component of the magnetic field Bx at the magnetic sensing element and the sensitivity Sn of the magnetic sensing element, as shown in Equation VI. The sensed signal V1 from magnetic sensing element 110a is shown in Equation XIV and an equation similar to Equation XIV can be obtained for the sensed signals Vn from each of the other magnetic sensing elements 110b-110i that are numbered 2-9, respectively.

$$V1 = S1 \times Bx1(R1, a, b) \qquad \text{Equation XIV}$$
$$= S1 \times B(R1) \times \cos a1 \times \cos b1$$

In Equation XIV the strength of the magnetic field B at the radial distance R1 from the center of conductor 102 to a point at the center of magnetic sensing element 110a is shown in Equation XV.

$$B(R1) = (\mu \times I)/R_1 \qquad \text{Equation XV}$$

Also, the cosine of "a1" is shown in Equation XVI and the cosine of "b1" is shown in Equation XVII.

$$\cos a1 = D_1/R_1 \qquad \text{Equation XVI}$$

$$\cos b1 = A/\sqrt{A^2 + (X2-X1)^2} \qquad \text{Equation XVII}$$

Substituting Equations XV, XVI and XVII into Equation XIV yields Equation XVIII, where R1 is calculated via the Pythagorean theorem.

$$\begin{aligned}V1(D1, X_1, X_2, I) &= (S1 \times (\mu \times I) \times D1 \times A)/ \\ &\quad \left(R1^2 \times \sqrt{A^2 + (X2-X1)^2}\right) \\ &= (S1 \times \mu \times I \times D1 \times A)/ \\ &\quad ((D1^2 + X1^2) \times \\ &\quad \sqrt{A^2 + (X2-X1)^2})\end{aligned} \qquad \text{Equation XVIII}$$

Thus, the sensed signal V1 that is sensed via magnetic sensing element 110a is a function of distance D1, offset distances X1 and X2, and the measured current I. An Equation similar to Equation XVIII for each of the other magnetic sensing elements 110b-110i is shown below in Equations XIX-XXVI, respectively.

$$V2(D1,X1,X2,I) = (S2 \times \mu \times I \times D1 \times A)/((D1^2+(X1+A)^2) \times \sqrt{A^2+(X2-X1)^2}) \qquad \text{Equations XIX}$$

$$V3(D1,X1,X2,I) = (S3 \times \mu \times I \times D1 \times A)/((D1^2+(X1+(2 \times A))^2) \times \sqrt{A^2+(X2-X1)^2}) \qquad \text{Equations XX}$$

$$V4(D2,X1,X2,X3,I)=(S4\times\mu\times I\times D2\times 2\times A)/((D2^2+X2^2)\times\sqrt{(2A)^2+(X3-X1)^2})$$ Equations XXI $$V5(D2,X1,X2,X3,I)=(S5\times\mu\times I\times D2\times 2\times A)/((D2^2+(X2+A)^2)\times\sqrt{(2A)^2+(X3-X1)^2})$$ Equations XXII $$V6(D2,X1,X2,X3,I)=(S6\times\mu\times I\times D2\times 2\times A)/((D2^2+(X2+(2\times A))^2)\times\sqrt{(2A)^2+(X3-X1)^2})$$ Equations XXIII $$V7(D3,X1,X2,X3,I)=(S7\times\mu\times I\times D3\times A)/((D3^2+X3^2)\times\sqrt{A^2+(X3-X2)^2})$$ Equations XXIV $$V8(D3,X1,X2,X3,I)=(S8\times\mu\times I\times D3\times A)/((D3^2+(X3+A)^2)\times\sqrt{A^2+(X3-X2)^2})$$ Equations XXV $$V9(D3,X1,X2,X3,I)=(S9\times\mu\times I\times D3\times A)/((D3^2+(X3+(2\times A))^2)\times\sqrt{A^2+(X3-X2)^2})$$ Equations XXVI Control circuit 106 receives signals V1 through V9 from magnetic sensing elements 110a-110i and determines calibration values and measures current I based on the signals V1-V9. The control circuit determines calibration values for two or more distances D1-D3 and two or more offset distances X1-X3. To measure current I and determine at least four calibration values, control circuit 106 processes the signals from at least five different magnetic sensing elements 110a-110i.

In general, to measure current I and determine a number of unknown calibration values CV, the control circuit, such as control circuit 106, processes the signals from at least CV+1 magnetic sensing elements, such as magnetic sensing elements 110a-110i. The control circuit processes the signals from at least one magnetic sensing element for each calibration value to be determined and the current to be measured.

In one embodiment, control circuit 106 receives the signals V1-V9 from magnetic sensing elements 110a-110i and excludes (does not use) the smallest signal levels, such as by excluding the signals that have signal levels below a signal level limit. In one embodiment, control circuit 106 receives the signals V1-V9 from magnetic sensing elements 110a-110i and excludes the signals from magnetic sensing elements 110a-110i that are saturated. In one embodiment, control circuit 106 receives the signals V1-V9 from magnetic sensing elements 110a-110i and uses at least two of the signals V1-V9 that have a signal difference that is greater than a signal difference limit.

Figure 4A:
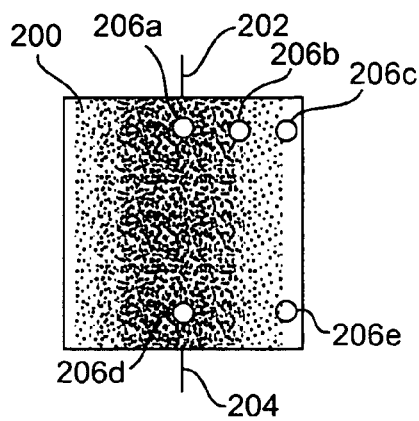
FIG. 4A is a diagram illustrating a magnetic sensor and the magnetic field generated via a current I1 carried by a conductor at a distance D1 from the magnetic sensor.
Figure 4B:
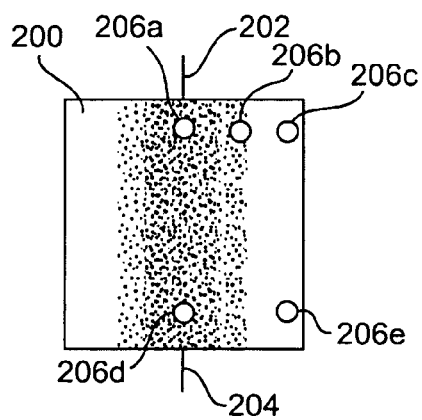
FIG. 4B is a diagram illustrating the magnetic sensor and a magnetic field generated via a current I2 carried by the conductor at the distance D1 from the magnetic sensor.
Figure 4C:
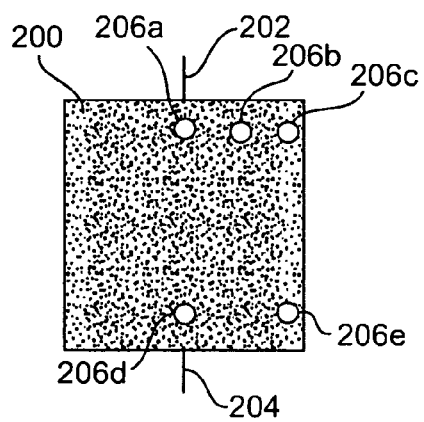
FIG. 4C is a diagram illustrating one embodiment of the magnetic sensor and the magnetic field generated via the current I1 carried by the conductor at a distance D2 from the magnetic sensor.

FIGS. 4A-4C are diagrams illustrating magnetic field distributions across one embodiment of a magnetic sensor 200. A current carrying conductor (not shown for clarity) traverses magnetic sensor 200 from the top center at 202 to the bottom center at 204 at a distance above magnetic sensor 200. The current carrying conductor generates a magnetic field that is distributed across magnetic sensor 200.

Each of the FIGS. 4A-4C shows a different magnetic field distribution. In FIG. 4A, a current I1 is carried by the conductor at a distance D1 above magnetic sensor 200. In FIG. 4B a current I2, which is less than current I1, is carried by the conductor at the distance D1 above magnetic sensor 200. In FIG. 4C the current I1 is carried by the conductor at a distance D2, which is greater than the distance D1, above magnetic sensor 200.

Magnetic sensor 200 includes magnetic sensing elements 206a-206e that sense the magnetic field. In one aspect, magnetic sensor 200 and magnetic sensing elements 206a-206e take an image of the magnetic field distribution across magnetic sensor 200. The two dimensional position of magnetic sensing elements relative to the conductor can be obtained using at least three signals from magnetic sensing elements 206a-206e. The three dimensional position of magnetic sensing elements relative to the conductor can be obtained using at least five signals from magnetic sensing elements 206a-206e. In one embodiment, magnetic sensor 200 includes fewer than the five magnetic sensing elements 206a-206e. In one embodiment, magnetic sensor 200 includes more than the five magnetic sensing elements 206a-206e, such as 10, 100 or more magnetic sensing elements.

FIG. 4A is a diagram illustrating magnetic sensor 200 and the magnetic field generated via current I1 carried by the conductor at distance D1 from magnetic sensor 200. Magnetic sensing elements 206a and 206d sense substantially the same magnetic field strength. Also, magnetic sensing elements 206c and 206e sense substantially the same magnetic field strength, which is less than the magnetic field strength sensed via magnetic sensing elements 206a and 206d. Magnetic sensing element 206b senses a magnetic field strength that is less than the magnetic field strength sensed via magnetic sensing elements 206a and 206d and more than the magnetic field strength sensed via magnetic sensing elements 206c and 206e.

FIG. 4B is a diagram illustrating magnetic sensor 200 and the magnetic field generated via current I2 carried by the conductor at the distance D1 from magnetic sensor 200. Current I2 is less than current I1 that is used to generate the magnetic field shown in FIG. 4A, which results in the strength of the magnetic field sensed via magnetic sensing elements 206a-206e in FIG. 4B being less than the strength of the magnetic field sensed via magnetic sensing elements 206a-206e in FIG. 4A.

In FIG. 4B, magnetic sensing elements 206a and 206d sense substantially the same magnetic field strength. Also, magnetic sensing elements 206c and 206e sense substantially the same magnetic field strength, which is less than the magnetic field strength sensed via magnetic sensing elements 206a and 206d. Magnetic sensing element 206b senses a magnetic field strength that is less than the magnetic field strength sensed via magnetic sensing elements 206a and 206d and more than the magnetic field strength sensed via magnetic sensing elements 206c and 206e.

FIG. 4C is a diagram illustrating one embodiment of magnetic sensor 200 and a magnetic field generated via current I1 carried by the conductor at a distance D2 from magnetic sensor 200. Distance D2 is greater than the distance D1 that is used to generate the magnetic field shown in FIG. 4A, which results in the strength of the magnetic field sensed via magnetic sensing elements 206a-206e in FIG. 4C being less than the strength of the magnetic field sensed via magnetic sensing elements 206a-206e in FIG. 4A.

In FIG. 4C, magnetic sensing elements 206a and 206d sense substantially the same magnetic field strength. Also, magnetic sensing elements 206c and 206e sense substantially the same magnetic field strength, which is less than the magnetic field strength sensed via magnetic sensing elements 206a and 206d. Magnetic sensing element 206b senses a magnetic field strength that is less than the magnetic field strength sensed via magnetic sensing elements 206a and 206d and more than the magnetic field strength sensed via magnetic sensing elements 206c and 206e.

Also, if the strength of the magnetic field sensed via magnetic sensing elements 206a and 206d is the same in FIGS. 4B and 4C, sensed signals from magnetic sensing elements 206c and 206e can be used to distinguish between the magnetic fields in FIGS. 4B and 4C.

Figure 5A:
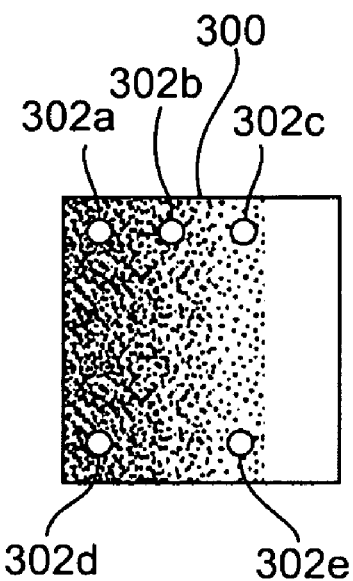
FIG. 5A is a diagram illustrating one embodiment of the placement of magnetic sensing elements that is good for sensing magnetic field strengths.
Figure 5B:
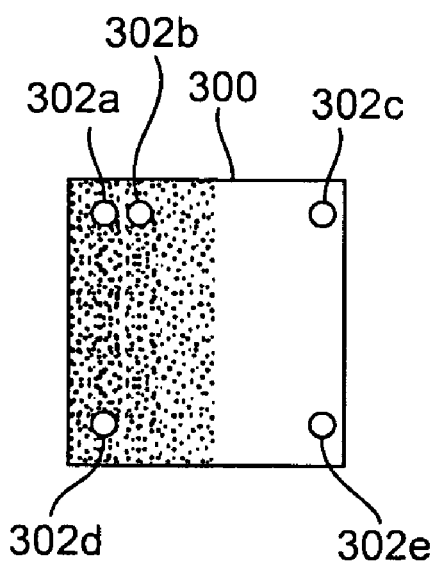
FIG. 5B is a diagram illustrating one embodiment of the placement of magnetic sensing elements that is not as good for sensing magnetic fields strengths.

FIGS. 5A and 5B are diagrams illustrating one embodiment of a magnetic sensor 300 and placement or usage of magnetic sensing elements 302a-302e on magnetic sensor 300. Each of the FIGS. 5A and 5B shows a different placement of magnetic sensing elements 302a-302e on magnetic sensor 300. Also, in each of the FIGS. 5A and 5B, a current carrying conductor runs parallel to the left side of magnetic sensor 300 at a distance above magnetic sensor 300 and the current carrying conductor generates a magnetic field that is distributed across magnetic sensor 300.

FIG. 5A is a diagram illustrating one embodiment of the placement of magnetic sensing elements 302a-302e that is good for sensing sufficient magnetic field strengths and sufficient differences in magnetic field strength. Each of the magnetic sensing elements 302a-302e is in an area where the magnetic field strength is sufficient for sensing and providing a sufficient sensed signal. Also, at least some of the magnetic sensing elements 302a-302e are spaced apart to provide sensed signals that are sufficiently different from one another.

FIG. 5B is a diagram illustrating one embodiment of the placement of magnetic sensing elements 302a-302e that is not as good for sensing sufficient magnetic field strengths and sufficient differences in magnetic field strength. In FIG. 5B, magnetic sensing elements 302a and 302b are to close to each other to provide sensed signals that are sufficiently different from one another, such that the noise in the system may degrade the information in the sensed signals. Also, magnetic sensing elements 302c and 302e are in areas where the magnetic field strength is to small to be useful, such that the noise in the system may degrade the information in the sensed signals.

In one embodiment of a system, the control circuit selects magnetic sensing elements to be used in the measurement of current I and the determination of the calibration values from a larger group of magnetic sensing elements in the magnetic sensor. In one embodiment, the control circuit determines whether the sensed signals are sufficiently different to be used in the measurement of current I and the determination of the calibration values. In one embodiment, the control circuit uses at least two sensed signals that have a signal difference greater than a signal difference limit. In one embodiment, the control circuit determines whether the sensed signals are sufficiently large to be used in the measurement of current I and the determination of the calibration values. In one embodiment, the control circuit excludes (does not use) the smallest signal levels, such as by excluding the signals that have signal levels below a signal level limit.

A system, such as system 20 and system 100, determines calibration values that indicate the position of magnetic sensing elements relative to the conductor carrying the measured current I. The magnetic sensing elements do not have to be precisely positioned and held in place to accurately measure the current I and the system does not use a magnetic field guide that adds cost to the sensor system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
    a conductor that carries a current, which generates a magnetic field that corresponds to the current;
    magnetic sensing elements configured to sense the magnetic field that is generated via the current and to provide signals that correspond to the magnetic field, wherein the magnetic sensing elements are attached to the conductor; and
    a circuit configured to determine calibration values that indicate a position of the magnetic sensing elements relative to the conductor based on the signals and to measure the current based on the signals, wherein the circuit uses one set of calibration values that indicate the position of the magnetic sensing elements relative to the conductor to determine a value of the current in each measurement of multiple consecutive measurements of the current.

2. The system of claim 1, wherein the current flows through the conductor and the circuit is configured to determine the calibration values that indicate the position of the magnetic sensing elements relative to the conductor in two dimensions.

3. The system of claim 1, wherein the circuit is configured to exclude the signals from the magnetic sensing elements that provide signal levels below a signal level limit.

4. The system of claim 1, wherein the circuit is configured to exclude the signals from the magnetic sensing elements that are saturated.

5. The system of claim 1, wherein the circuit is configured to include at least two signals having a signal difference that is greater than a signal difference limit.

6. The system of claim 1, wherein the magnetic sensing elements are one of magneto-resistive sensing elements and Hall plate sensing elements.

7. The system of claim 1, wherein the magnetic sensing elements are giant magneto-resistive sensing elements.

8. The system of claim 1, wherein the circuit includes the signals from at least one magnetic sensing element for each of the calibration values to be determined and the current to be measured.

9. The system of claim 8, wherein the current flows through the conductor and the circuit is configured to determine the calibration values that indicate the position of the magnetic sensing elements relative to the conductor in three dimensions.

10. A system comprising:
    magnetic sensing elements configured to sense a magnetic field that is generated via a current carrying conductor and provide signals that correspond to the magnetic field, wherein the magnetic sensing elements are attached to the current carrying conductor; and
    a circuit configured to determine the position of the magnetic sensing elements relative to the current carrying conductor based on the signals and to measure the current based on the signals, wherein the circuit determines the current and the position of one of the magnetic sensing elements relative to the current carrying conductor in two dimensions using the signals from three or more magnetic sensing elements.

11. The system of claim 10, wherein the circuit is configured to determine a three dimensional position of the magnetic sensing elements relative to the current carrying conductor based on the signals from at least five magnetic sensing elements.

12. The system of claim 10, wherein the circuit is configured to exclude the signals from the magnetic sensing elements that provide signal levels below a signal level limit.

13. The system of claim 10, wherein the circuit is configured to exclude the signals from the magnetic sensing elements that are saturated.

14. The system of claim 10, wherein the circuit is configured to include at least two signals that have a signal difference that is greater than a signal difference limit.

15. A method of measuring a current comprising:
sensing a magnetic field generated by the current via magnetic sensing elements;
providing sensor signals that correspond to the magnetic field via the magnetic sensing elements;
including in the sensor signals at least two sensor signals from different magnetic sensing elements, wherein the at least two sensor signals have a sensor signal value difference that is greater than a sensor signal value difference limit;
determining calibration values in a non-iterative process based on the at least two sensor signals; and
measuring the current using the calibration values.

16. The method of claim 15, comprising:
conducting the current via a conductor, wherein determining calibration values comprises:
determining the calibration values that indicate the position of the magnetic sensing elements relative to the conductor.

17. The method of claim 15, comprising:
excluding the sensor signals from the magnetic sensing elements that provide signal levels below a signal level limit.

18. The method of claim 15, comprising:
excluding the sensor signals from the magnetic sensing elements that are saturated.

19. The method of claim 15, comprising:
determining the calibration values each time the current is measured.

20. The method of claim 15, comprising:
measuring the current multiple times between updates of the calibration values.

21. A method of measuring a current comprising:
sensing a magnetic field generated via a conductor carrying the current via magnetic sensing elements attached to the conductor;
, providing signals that correspond to the magnetic field via the magnetic sensing elements;
determining the position of the magnetic sensing elements relative to the conductor based on the signals; and
measuring the current based on the signals and the position of the magnetic sensing elements relative to the conductor, wherein measuring the current and determining the position of one of the magnetic sensing elements relative to the conductor in two dimensions comprises:
using the signals from three or more magnetic sensing elements.

22. The method of claim 21, wherein measuring the current and determining the position of the magnetic sensing elements relative to the conductor in three dimensions comprises:
determining the position of at least five magnetic sensing elements relative to the conductor in three dimensions.

23. A system comprising:
a conductor that carries a current, which generates a magnetic field that corresponds to the current;
magnetic sensing elements situated in a plane that is substantially parallel to current flow through the conductor and configured to sense the magnetic field that is generated via the current and provide signals that correspond to the magnetic field, wherein the magnetic sensing elements are attached to the conductor; and
a circuit configured to determine calibration values based on the signals and to measure the current based on the signals.

24. The system of claim 23, wherein the circuit uses one set of calibration values to determine a value of the current in each measurement of multiple measurements of the current.

25. The system of claim 23, wherein two or more of the magnetic sensing elements are at different radial distances from the center of the conductor.

* * * * *